United States Patent
Smith

(10) Patent No.: US 6,242,902 B1
(45) Date of Patent: Jun. 5, 2001

(54) MEASURING CONFIGURATION, AND USE OF THE MEASURING CONFIGURATION

(75) Inventor: Norman A. Smith, Alpharetta, GA (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/443,749

(22) Filed: Nov. 19, 1999

(51) Int. Cl.[7] .................................................. G01R 1/20
(52) U.S. Cl. ................................................................ 324/127
(58) Field of Search ..................... 324/127, 129, 324/133

(56) References Cited

U.S. PATENT DOCUMENTS

| | | |
|---|---|---|
| 4,117,437 | 9/1978 | Ottesen . |
| 4,320,372 | 3/1982 | Thuries . |
| 4,443,779 | 4/1984 | Thuries . |
| 4,486,633 | 12/1984 | Calvino . |
| 4,670,625 | 6/1987 | Wood et al. . |
| 4,686,518 * | 8/1987 | Schweitzer ........................ 340/664 |
| 4,775,849 | 10/1988 | Lucas . |
| 5,569,891 | 10/1996 | Freeman et al. . |

OTHER PUBLICATIONS

Japanese Patent Abstract JP63104412 (Mitsuo et al.), dated May 9, 1988.
Japanese Patent Abstract JP10241475 (Yuji), dated Sep. 11, 1998.

* cited by examiner

Primary Examiner—Safet Metjahic
Assistant Examiner—Vincent Q. Nguyen
(74) Attorney, Agent, or Firm—Herbert L. Lerner; Laurence A. Greenberg; Werner H. Stemer

(57) ABSTRACT

A measuring configuration for transforming an electric variable on a high-voltage line into a measurable variable. An electrically conductive hollow body that can be connected to a ground potential is connected to a hollow insulating body so as to produce in the interior a cavity through which an electric conductor is guided. In this case, a section of the insulating body at an end of the hollow body side is walled around externally with an electrode body. An electric transformer externally surrounds the hollow body. The measuring configuration is explosion-proof and can be produced in a comparatively cost-effective fashion.

21 Claims, 9 Drawing Sheets

MEASURING CONFIGURATION, AND USE OF THE MEASURING CONFIGURATION

BACKGROUND OF THE INVENTION

Field of the Invention

The invention relates to a measuring configuration for measuring an electric variable, in particular a current intensity, on a high-voltage line by an electric transformer. The invention also relates to the use of such a measuring configuration.

A measuring configuration of this type is generally used for the purpose of monitoring the characteristic of the current intensity in a high-voltage system in order to be able to detect peaks in the current intensity in good time in the case of line damage. The measuring configuration is likewise used for the purpose of monitoring load-dependent currents. Furthermore, the measuring configuration is also used for the purpose of determining for high-voltage switching devices the correct disconnecting instant for interrupting the circuit.

In this case, the size and configuration of the individual components of the measuring device comply with the requirements set by the specific application or the specific site of application as regards mechanical or electric loading.

Usually, a measuring configuration for determining an electric variable on a high-voltage line such as, in particular, the current intensity, contains a container or tank which is at a high-voltage potential and through which the high-voltage line is guided by a continuous electric conductor. Disposed around the electric conductor in the interior of the tank is a usually annular electric transformer at which a measuring signal can be tapped. In order to insulate the transformer from the electric conductor and from the tank, the interior of the tank is filled with an insulating oil. In order to insulate the electric transformer further from the continuous conductor, the electric conductor can additionally have an insulating coating made from plastic or paper. The electric transformer itself is mostly configured as an electric coil, and in this case typically has a steel core around which a specific number of windings made from an insulated wire are wound. The voltage building up inductively in the windings is tapped from outside as a measuring signal via measuring terminals. Given a known number of windings, it is thereby possible to reach a conclusion as to the current intensity in the high-voltage line.

As a rule, the tank having the transformer and the continuous electric conductor is disposed at the height of the high-voltage line. For this purpose, the tank is disposed on an insulator or insulating body that insulates the tank from ground potential. The mechanical properties of the insulator must be selected in this case such that the insulator withstands the mechanical loads that arise from the weight of the measuring configuration. In particular, in areas at risk from earthquakes this requires high requirements to be set on the mechanical loadability of the insulator. The insulator is made from porcelain as a rule, for this reason.

The insulator itself is installed via a support configuration on the ground. The support configuration in this case has an evaluating device that evaluates the measuring signal of the electric transformer. The measuring terminals of the electric transformer are guided for this purpose through the insulator into the evaluating device. The measuring terminals are electrically insulated in this case from the tank of the transformer. Usually, maintaining or replacing the insulating oil is also undertaken via the support configuration.

Since the tank in which the electric transformer is disposed is at the same potential as the continuous electric conductor, and thus at the same potential as the high-voltage line, the term "live-tank measuring configuration" is also used for such a measuring device.

The measuring configuration described has been successfully used for many years in high-voltage technology. Nevertheless, such a measuring configuration disadvantageously harbors certain risks. Thus, for example, in the case of high mechanical loading, the porcelain insulator can burst and endanger the surroundings of the measuring configuration by flying fragments. Furthermore, ignition of the insulating oil, which may entail an explosion of the container of the measuring configuration, can occur in the case of a short circuit of the high-voltage line in the vicinity of the container or in the container itself, in particular between the continuous conductor and the electric transformer. Again, such an explosion endangers not only the measuring configuration itself, but also the immediate and close surroundings. Thus, both the insulating oil and the porcelain insulator harbors a certain safety risk in the measuring configuration of conventional construction.

For this reason, strict safety regulations must be followed when installing the measuring configuration and when maintaining and changing the insulating oil. Furthermore, when configuring the insulator it must be ensured that it also withstands mechanical loads that exceed the loading owing to the weight of the oil-filled container. Nevertheless, a porcelain insulator that is under a high compressive stress poses a relatively high risk. In particular, when the porcelain insulator is wantonly destroyed, it splits up explosively, with the result that the flying fragments can cause grave injuries.

In addition to the safety risks described for the measuring configuration of conventional construction, the measuring configuration is also relatively expensive because of the required size of the post insulator and because of the requirement for insulating oil. The maintenance of the measuring configuration is also time-consuming and expensive because of the safety regulations to be observed.

Even if, as currently known, the porcelain insulator of the measuring configuration is replaced by a so-called composite insulator which contains an inner tube made from a glass fiber reinforced plastic and sheds, applied thereto, made from a silicone rubber, this composite insulator must nevertheless be capable of bearing the load of the oil-filled container in the interior of which the electric transformer and the continuous electric conductor are disposed. For this reason, it is necessary in the case of a composite insulator as well for the diameter of the inner tube to be selected to be relatively large, and this in turn greatly increases the costs of production and material, since, in particular, the required quantity of expensive silicone rubber for the sheds is increased.

SUMMARY OF THE INVENTION

It is accordingly an object of the invention to provide a measuring configuration, and use of the measuring configuration which overcomes the above-mentioned disadvantages of the prior art devices of this general type, which can be produced comparatively inexpensively and which avoids the safety risks of a measuring configuration of the conventional type.

With the foregoing and other objects in view there is provided, in accordance with the invention, a configuration for transforming an electric variable into a measurable variable, including a current intensity, on a high-voltage line, including:

a continuous electric conductor for making contact with the high-voltage line;

at least one hollow insulating body for insulating a potential of the high-voltage line from a ground potential and having an interior formed therein; an electrically conductive hollow body that can be connected to the ground potential and having an end and an interior formed therein, the electrically conductive hollow body connected to the at least one hollow insulating body in such a way as to define via the interior of the electrically conductive hollow body and the interior of the at least one hollow insulating body a cavity through which the continuous electric conductor is guided;

an electric transformer for converting the electric variable into a measured variable, the electric transformer at least partially externally surrounding the electrically conductive hollow body; and a metallic electrode body surrounding on an outside a section of the at least one insulating body disposed at the end of the electrically conductive hollow body, the metallic electrode body equalizing a present electric field strength.

In a first step, the invention proceeds from the consideration that the risk of short-circuiting in the tank can be reduced when the electric transformer does not directly surround the electric conductor. Instead, the electrical transformer is disposed outside an electrically conductive hollow body which can be connected to ground potential and through the interior of which the continuous electric conductor which can make contact with the high-voltage line passes. Consequently, the insulation of the electric transformer from the electric conductor at high-voltage potential can be eliminated. A short circuit between the conductor and transformer is no longer possible. The introduction of insulation is required, if at all, only between the conductor and hollow body.

Furthermore, in a second step, the invention proceeds from the consideration that the dimension of the insulator or insulating body used in the measuring configuration for the insulation of the high-voltage potential from the ground potential is essentially determined by the electric conditions and by the load to be carried. The dimensions of the insulating body can, however, now be reduced because the weight of the insulating oil used to date is reduced by disposing the transformer outside the hollow body.

Apart from the load to be carried, the dimension of the insulator or insulating body is determined for prescribed electric characteristics by the spacing of the electric conductor which makes contact with the high-voltage line from the fastener or metal part of the insulator, which is at ground potential. The spacing must be selected to be at least so large that the voltage is reliably prevented from flashing over. In addition, in the case of hollow insulators of conventional construction there is installed between the fastener and the continuous electric conductor, an electrode body that can make contact with ground potential and has the task of reducing high electric field strengths which emanate from the corners or edges of the fastener. As a rule, in the case of a cylindrical hollow insulator the electrode body is configured as a hollow cylinder fitted in the interior of the insulator.

Consequently, given the stipulation of the voltage to be insulated and of the dielectric constant of the medium located between the conductor and the electrode body, the dimension of the insulator or insulating body is determined very largely by the space between the continuous electric conductor and the electrode body. Since the electrode body is disposed in the interior of the insulator, it follows that the base area of the insulator is always greater than that of the electrode body. The base area is understood here to be the cross section of the hollow insulator or the electrode body plus the cross section of the respective inner cavity.

It is here that the invention recognizes that the dimension of the insulating body can be further reduced when the metallic electrode body is not disposed in the interior of the insulating body, but walls the insulating body around outside. Because of this measure, the insulating body has a smaller base area than the electrode body that, after all, walls the insulating body around outside. In contrast with an insulating body with an internal electrode body, the insulating body with an external electrode body has a smaller cross section given the same spacing of the electric conductor from the electrode body. Since, in addition, the insulating material of the insulating body, that is to say a material with a high dielectric constant, is disposed between the conductor and the electrode body, the spacing between the conductor and the electrode body can be further reduced without needing to fear a flashover. The dimension of the insulating body required to insulate the electric conductor can thus be substantially reduced by comparison with an insulating body of conventional construction and this signifies a major cost advantage.

In a third step, the invention recognizes that the measuring configuration can be integrated directly into the high-voltage line because of the now relatively slight dead load of the insulating body. This integration is performed by virtue of the fact that the hollow body which is surrounded on the outside by the electric transformer is connected to the insulating body in such a way as to produce in the interior of the hollow body and the insulating body a cavity through which the electric conductor, which can be part of the high-voltage line, is guided. A post insulator is no longer required. The hollow body can make contact with the frame.

Thus, in addition to the advantage of low costs and a lower safety risk, the invention additionally offers the advantage of a low dead weight and the possibility of integration in an existing high-voltage line. For this purpose, the continuous electric conductor is simply installed in an existing high-voltage line.

A flange is advantageously disposed on the electrode body for the purpose of connecting the insulating body to the cavity. Since the electrode body is disposed outside the insulating body, such a flange can be fastened directly on the electrode body. In this case, the fastening can be performed, for example, by a welded, rotary or screwed connection. The insulating body can be permanently connected in a simple way to the hollow body via the flange. In this case, a flange is to be understood as a snap-action, rotary or screwed connection.

It is particularly advantageous when the electrode body and the flange form a basic unit. For this purpose, the flange and the electrode body are formed jointly from a metal, or else produced jointly using a metal-spraying or metal-casting method. This is particularly favorable in terms of production engineering and saves costs. Again, the outlay on maintenance for subsequent connection between the electrode body and the flange is eliminated.

In a further advantageous refinement of the invention, the electrode body is part of the hollow body. In this case, the hollow body is fused with the electrode body to form one component, and connected to the insulating body via the electrode body wound around one section of the insulating body. Except for the connection, always required, between the electrode body and the insulating body, there is no need for any further mechanical connection. The production costs are lowered because of the joint production of the electrode body and the hollow body. Since the number of the mechanical connections is minimized, there is also a reduction in the time and outlay for maintenance work on the measuring configuration.

In a further refinement of the invention, the electric transformer is a current transformer. A current transformer contains in this case, as a rule, a number of insulated windings on a metal core. In this case, the metal core is of annular construction as a rule and surrounds the electric conductor. The current of the high-voltage line is tapped inductively via the current transformer. The number of the windings in this case determines the ratio between the measuring current intensity tapped as a measuring signal at the current transformer and the actual current intensity of the high-voltage line. It is also possible to measure a voltage built-up in the windings of the current transformer. This voltage also depends on the current intensity in the high voltage line.

In a particularly advantageous refinement of the invention, two hollow insulating bodies are connected to the hollow body in such a way as to produce in the interior of the hollow body and the two insulating bodies a continuous cavity through which the electric conductor is guided. This refinement permits a particularly simple integration of the measuring configuration in a high-voltage line. For this purpose, the ends, averted from the hollow body, of the insulating bodies can respectively have connecting pieces for fastening to the high-voltage line. The continuous electric conductor traversing the cavity then, as it were, bridges the high-voltage line or is a part thereof.

Although it is conceivable that one of the two insulating bodies is configured in a conventional way, that is to say has the electrode body situated in the interior of the insulating body, it is expedient when both insulating bodies in each case have at the end on the hollow body side a section which is walled around on the outside with the metallic electrode body. The overall weight and the total costs of the measuring configuration are reduced in this way. In particular, the two insulating bodies can be produced in the same way.

It is particularly advantageous regarding the connection of the two insulating bodies to the hollow body when the electrode body of one insulating body is simultaneously a component of the hollow body, and when the electrode body of the other insulating body is connected to the hollow body via a flange. In this way, in addition to the always necessary mechanical connections between the two electrode bodies and the insulating bodies, the overall measuring configuration has only one further mechanical connection, specifically that between the electrode body of one insulating body and the hollow body which forms a basic unit with the electrode body of the other insulating body.

Although the material of the insulating body per se plays no role in the configuration of the electrode body on the outside, it is, nevertheless, particularly advantageous when each insulating body is made from a fiber reinforced plastic. By contrast with a ceramic, such a material, to be precise, has a surface of a smooth nature, with the result that the electrode body can be applied directly to the insulating body, possibly with the use of an adhesive. A particularly firm connection between a metallic electrode body and the insulating body consisting of fiber reinforced plastic can be produced by shrink-fit technology, which has been known for a long time. In this case, the inside diameter of the electrode body is slightly smaller than the outside diameter of the insulating body. In order to join the two components, the electrode body is heated, thus enlarging its inside diameter. In the heated state, the electrode body can then be pushed on the outside onto the insulating body. As it cools, the electrode body shrinks, thus producing a firm and permanent connection to the insulating body. If appropriate, an adhesive can be introduced between the insulating body and the electrode body. It is also possible to introduce furrows into the insulating body so that the adhesive is not pressed out of the connecting point as the electrode body cools. This results simultaneously in a gas-tight connection between the electrode body and the insulating body. Glass fibers are particularly suitable as the fibers.

It is further advantageous as regards the electric insulation of the insulating body when a sheath with a number of sheds is disposed on the outside of each insulating body. In this case, the sheds increase the creepage path along the outside of the insulating body, and this is particularly advantageous when there is contamination of the surface.

As regards the method of production and as regards the gas-tightness of the connection between the electrode body and the insulating body, it is advantageous, furthermore, when the sheath is also drawn at least over a part of the electrode body.

In a particularly advantageous refinement of the invention, the sheath consists of an elastomer, in particular of a silicone rubber. Since the sheath consists of a material other than the insulating body itself, the term composite insulator is used, as a rule. In this case, despite its comparatively high price silicone rubber has proved itself as material for the sheath because of its durability and a high degree of weather resistance, and because of the hydrophobic nature of its surface.

In a further advantageous refinement of the invention, the electric transformer is covered together with the hollow body by a weather-resistant tank. This is particularly suitable for open air use of the measuring configuration. The weather-resistant tank advantageously is formed of an electrically conductive material and is connected in an electrically conductive fashion on one side to the hollow body. Because the weather-resistant tank is connected in an electrically conductive fashion on one side to the hollow body, the measurement variable can be measured by the electric transformer in the interior of the weather-resistant tank.

As regards the insulation of the electric conductor traversing the measuring configuration from the hollow body, which can be at ground potential, it is further advantageous when the cavity of the measuring configuration is gas-tight and can therefore be evacuated. It is further advantageous when the gas-tight cavity is filled with the protective gas $SF_6$. In contrast with insulating oil, $SF_6$ exhibits no explosive tendency.

The measuring device advantageously contains a fastener on a supporting mast. In this case, the supporting mast can be a separately standing mast; however, it can also be an already existing mast of the high-voltage line. Because of the low dead weight of the measuring configuration, there are no special requirements to be placed on the supporting mast for bearing the measuring configuration. For example, a rod anchored appropriately in the ground, a bar or a tube would suffice as such a supporting mast.

In a particularly advantageous way, the measuring configuration can be used in combination with a live-tank high-voltage switching device. In this case, a live-tank high-voltage switching device is understood as a high-voltage switching device in which the or each switching element for interrupting the high-voltage line is disposed in the vicinity or in the interior of a tank at high-voltage potential (live).

Such high-voltage switching devices are customary in Europe and are borne at the height of the high-voltage line by a separate post insulator constructed for the load to be borne. In order to detect the switching instant suitable for the high-voltage switching device, to date a measuring configuration for determining the voltage in the high-voltage line has been installed, in accordance with the prior art configuration described at the beginning, separately on an appropriate post insulator at a short spacing from the high-voltage switching device. Owing to the low dead weight of the measuring configuration according to the invention, it is now obvious to couple the measuring configuration directly to the live-tank high-voltage switching device, and to co-use the post insulator of the live-tank high-voltage switching device as a supporting mast for the measuring configuration itself.

In a particularly advantageous way, a switching element of the live-tank high-voltage switching device is disposed in the cavity of the measuring configuration. This drastically reduces the overall installation space and the total number of the individual components of the overall configuration containing the live-tank high-voltage switching device and measuring configuration. However, this does signify a substantial cost advantage by comparison with the previous solutions in accordance with the prior art.

Other features which are considered as characteristic for the invention are set forth in the appended claims.

Although the invention is illustrated and described herein as embodied in a measuring configuration, and use of the measuring configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
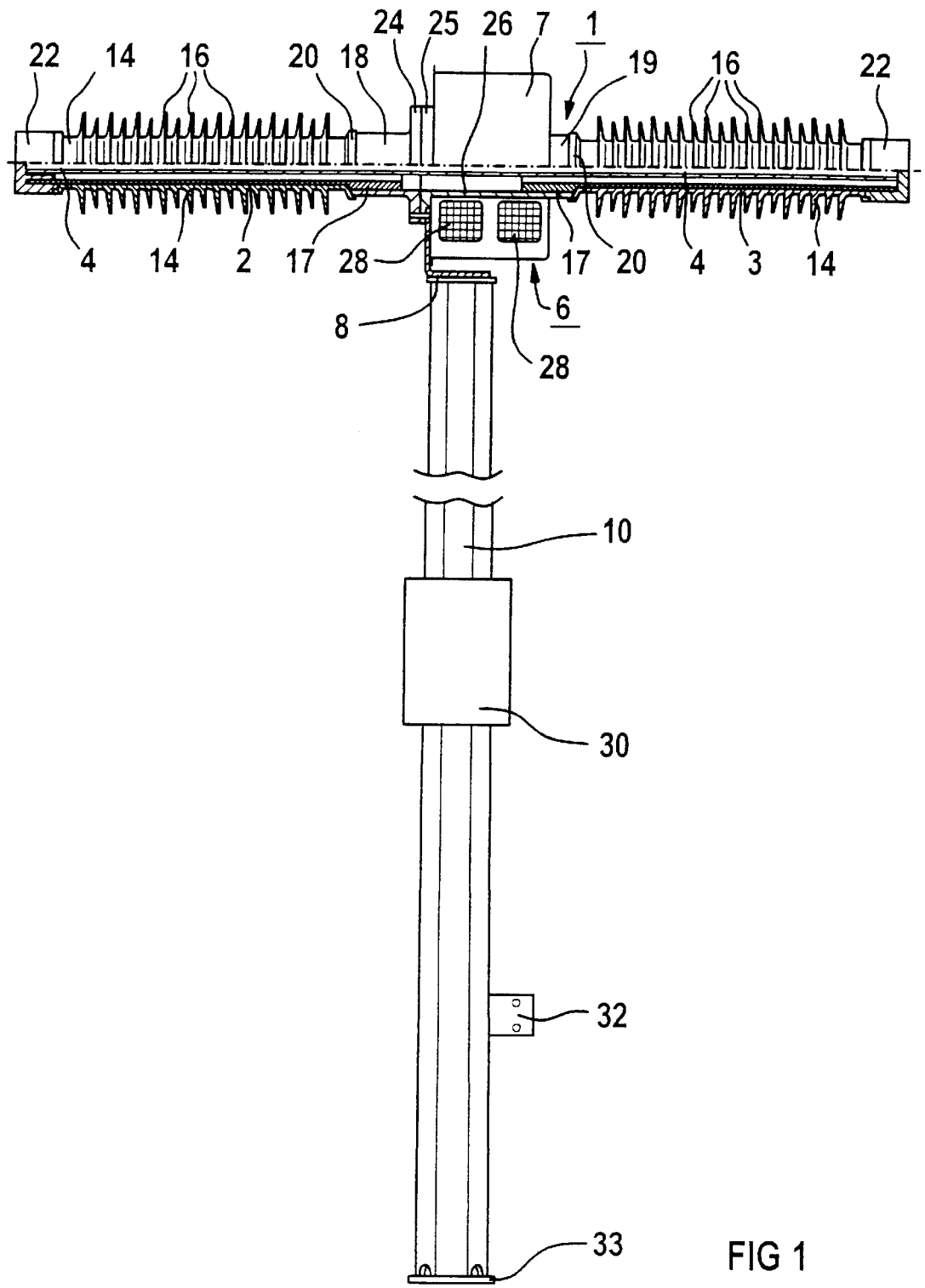
FIG. 1 is a diagrammatic, exploded, partially broken-away, front-elevational view of a measuring configuration mounted on a supporting mast and having two hollow insulating bodies according to the invention.

In all the figures of the drawing, sub-features and integral parts that correspond to one another bear the same reference symbol in each case. Referring now to the figures of the drawing in detail and first, particularly, to FIG. 1 thereof, there is shown a measuring configuration 1 with two hollow insulating bodies 2 and 3, a continuous electric conductor 4, an electric transformer 6 and a weather-resistant tank 7. The two hollow insulating bodies 2 and 3 are disposed in a row.

The measuring configuration 1 is fastened on a supporting mast 10 via a fastener 8 configured as a plate.

The two hollow insulating bodies 2 and 3 are produced from a glass fiber reinforced plastic. A sheath 14 made from silicone rubber is disposed in each case on the outside of the two insulating bodies 2 and 3. In order to increase a creepage path on the outside of the sheath 14, the latter contains a number of sheds 16. One section 17 in each case of the two insulating bodies 2 and 3 is permanently walled around with a metallic electrode body 18, 19. In this case, the sheath 14 or the two insulating bodies 2 and 3 extend respectively over a section 20 of the electrode bodies 18 and 19. The electrode bodies 18 and 19 are each firmly applied to the sections 17 of the insulating bodies 2 and 3 using a shrink-fit method with the interposition of an adhesive.

Connections 22 for fastening the measuring configuration 1 on a high-voltage line are fitted in each case on outer ends of the insulating bodies 2 and 3. In order to simplify the production technique, the connections 22 are applied in this case to the hollow insulating bodies 2 and 3 in the same way as the electrode bodies 18 and 19. The connections 22 make electric contact with the electric conductor 4 traversing the measuring configuration 1 on the inside. The electric conductor 4 itself is configured in accordance with the electric requirements.

The electrode body 18 of the hollow insulating body 2 forms a basic unit with a flange 24. The flange 24 and the electrode body 18 are produced jointly from one piece, or cast in one piece. The flange 24 is permanently screwed to a flange 25 which, in turn, is part of a hollow body 26 disposed in the interior of the weather-resistant tank 7. In the representation shown, the hollow body 26 is, in turn, fused with the electrode body 19 to form a basic unit. Here, the hollow body 26 has the same diameter as the electrode body 19 in the case shown. By contrast with the electrode body 18, the electrode body 19 is merely lengthened, the lengthened segment of the electrode body 19 forming the hollow body 26.

Two annular measuring coils 28, which together form the electric transformer 6, are disposed around the cylindrical hollow body 26. The two annular coils 28 each contain an annular steel core—not shown here in more detail—around which a prescribed number of insulated windings are laid. Conclusions can be drawn inductively concerning the current intensity prevailing in the high-voltage line, and thus in the continuous electric conductor 4, via measuring connections (likewise not represented in more detail).

The current inductively caused in the coils 28 is tapped as a measuring signal and evaluated, via connecting lines not represented, on an evaluation device 30 integrated in the supporting mast 10. The electrode bodies 18 or 19, the hollow body 26 and the weather-resistant tank 7 all formed of a metal are grounded via the fastener 8 and via the supporting mast 10 by a frame ground terminal 32, and are therefore all at ground potential.

The entire supporting mast 10 is firmly anchored on the ground via a base plate 33.

The entire cavity in the interior of the measuring configuration 1 is sealed in a gas-tight fashion toward the outside and can therefore optionally be filled with an insulating gas such as, in particular, $SF_6$.

Figure 2:
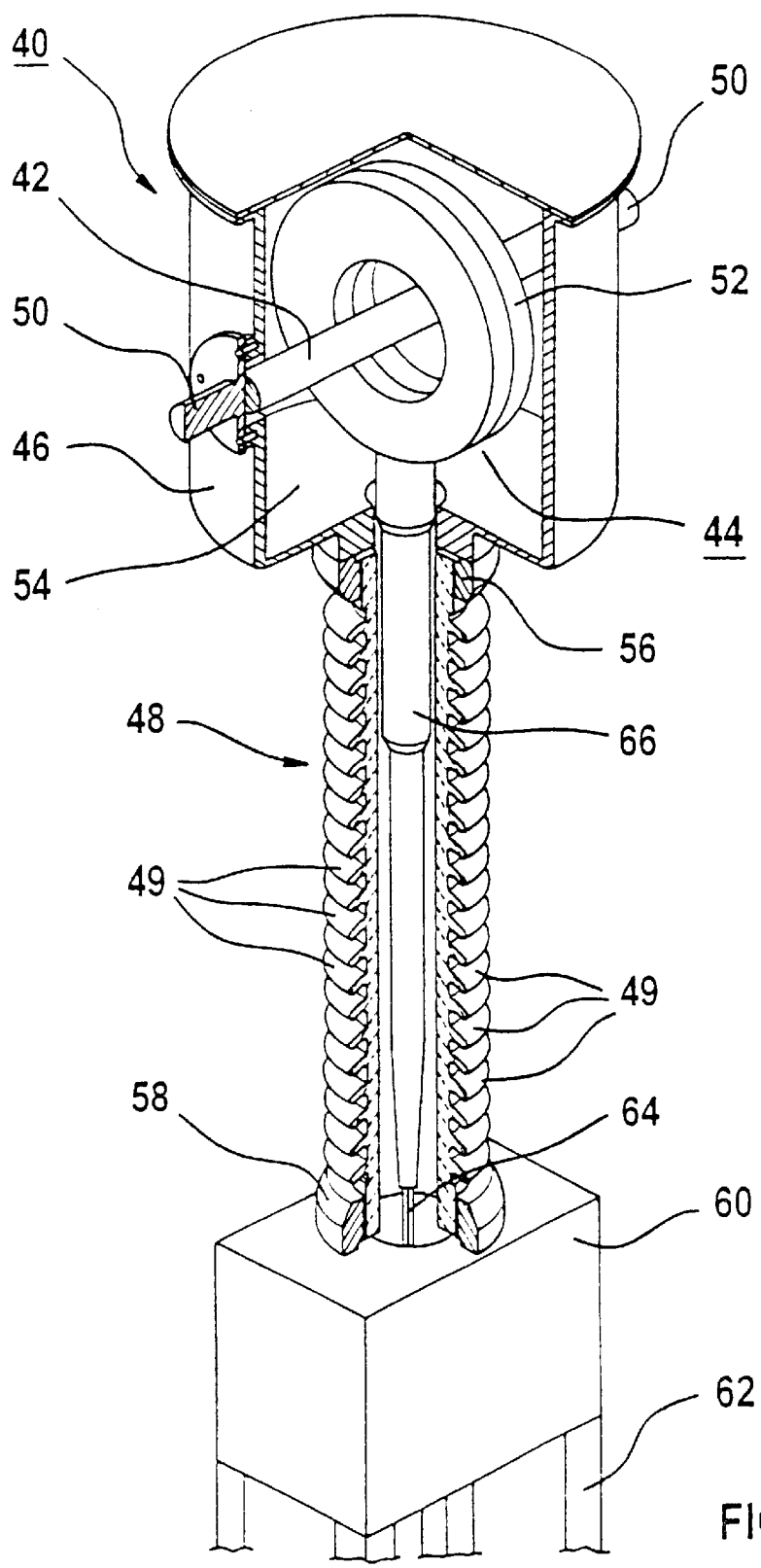
FIG. 2 is a perspective, partially broken-away view of the measuring configuration mounted on a ceramic post insulator in accordance with the prior art.

FIG. 2 shows, in a perspective and partially broken up fashion, a measuring configuration 40 of conventional design for measuring the current intensity in the high-voltage line.

The measuring configuration 40 in accordance with the prior art contains a continuous electric conductor 42 and an electric transformer 44 surrounding the electric conductor 42 in an annular fashion. The electric conductor 42 and the electric transformer 44 are disposed in an interior of a tank 46 which likewise makes contact with the high voltage of the high-voltage line via the electric conductor 42.

The tank 46 is fastened on a hollow post insulator 48 that is configured mechanically to bear the load and additionally insulates the tank 46 from ground potential. The hollow post insulator 48 is produced for this purpose from porcelain and has on the outside a number of sheds 49 for increasing the outer creepage path.

The electric conductor 42 has terminals 50 for switching into the high-voltage line.

The electric transformer 44 is configured as a coil 52 that contains an annular steel core and a number of insulated windings disposed thereon. The entire interior of the tank 46 is filled with an insulating oil 54 for the purpose of insulating the electric transformer 44 from the electric conductor 42 and from the metallic tank 46.

The hollow post insulator 48 is fastened on the tank 46 via a metal part 56, and on an evaluation device 60 via a metal part 58. The evaluation device 60 itself is borne by a supporting body 62 that is firmly anchored on the ground.

By a measuring cable 64 through the interior of the parts 56 and 58 and through the interior of the post insulator 48, the current caused inductively in the electric transformer 44 is tapped and evaluated in the evaluation device 60. In order, in particular, to achieve insulation of the measuring cable 64 from the metallic part 56, the measuring cable 64 has an insulating sheath 66. The configuration and thickness of the insulating sheath 66 vary in this case along the path from the part 56 to the part 58. Thus, very good insulation is required from the part 56 being at a high-voltage potential, and only a slight insulation, or no more at all, of the measuring cables 64 from the part 58 being at ground potential is still required.

As already mentioned, the post insulator 48 consisting of porcelain tends to split apart explosively when damaged because of the high weight of the container 46 filled with the insulating oil 54. Likewise, in the event of an electric flashover between the electric conductor 42 and the electric transformer 44 the insulating oil 54 in the tank 46 can easily ignite and thereby cause the tank 46 to explode.

Figure 3:
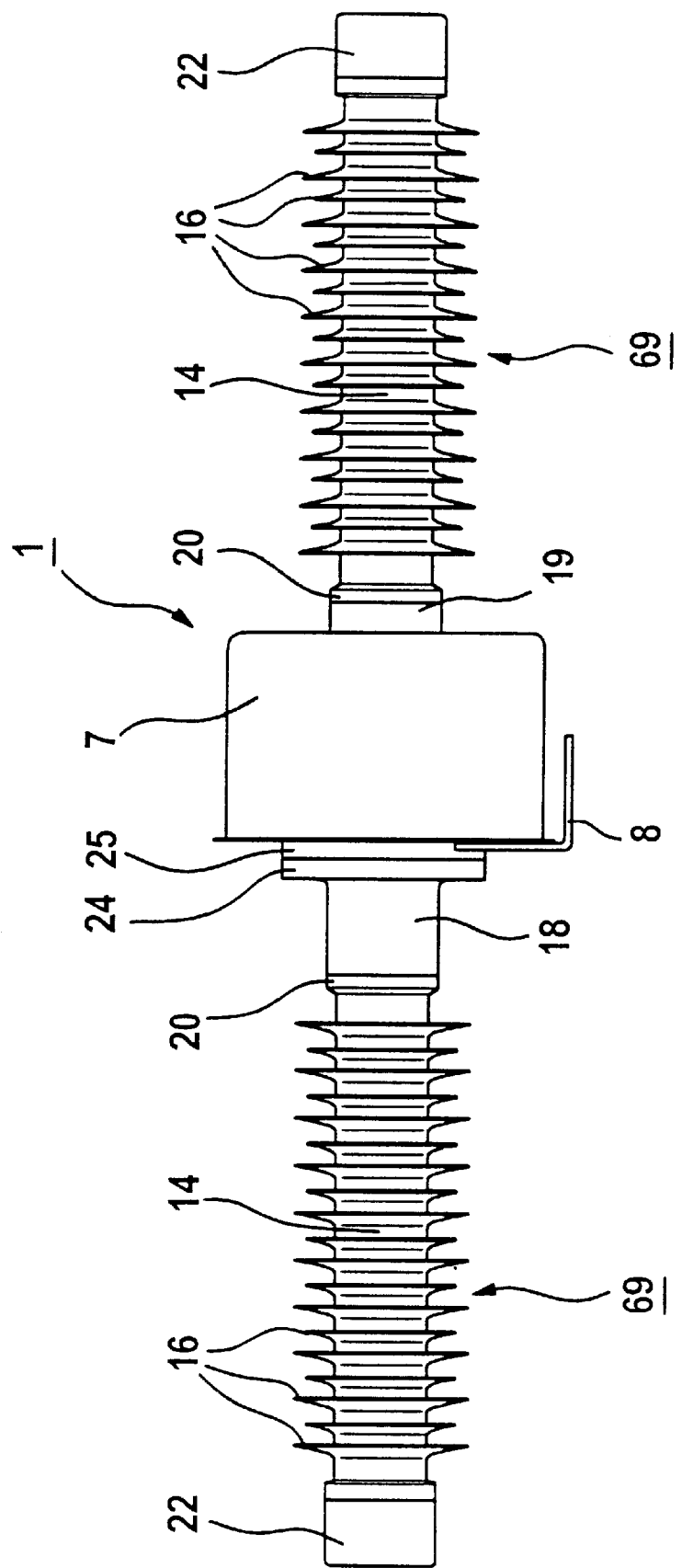
FIG. 3 is a side-elevational view of the measuring configuration in accordance with FIG. 1 and in accordance with the invention.

In FIG. 3, the measuring configuration 1 in accordance with FIG. 1 is shown. The metallic weather-resistant tank 7 is disposed over the electric transformer 6 in the middle of the measuring configuration 1. The electrode body 18 is screwed via the flange 24 to the flange 25 which, in turn, is a component of the hollow body 26 disposed in the interior of the weather-resistant tank 7.

The grounding of the electrode bodies 18 and 19 and of the (not visible) hollow body 26 disposed in the interior of the weather-resistant tank 7 is performed via the fastener 8 which can be connected to a grounded supporting mast 10.

The insulating bodies 2, 3 (not visible in FIG. 3) disposed on both sides of the hollow body 26 or of the weather-resistant tank 7 are each coated with the outer sheath 14 made from a silicone rubber. In this case, the sheath 14 has a number of the sheds 16 and overlaps a section 20 of the respective electrode bodies 18, 19. The insulating bodies 2, 3 and the outer sheath 14 in this case respectively form a so-called composite insulator 69. The connecting piece 22 is disposed in each case at the outer ends of the two composite insulators 69 for the purpose of making contact between the electric conductor 4 running in the interior of the measuring configuration 1 and a high-voltage line.

Figure 4:
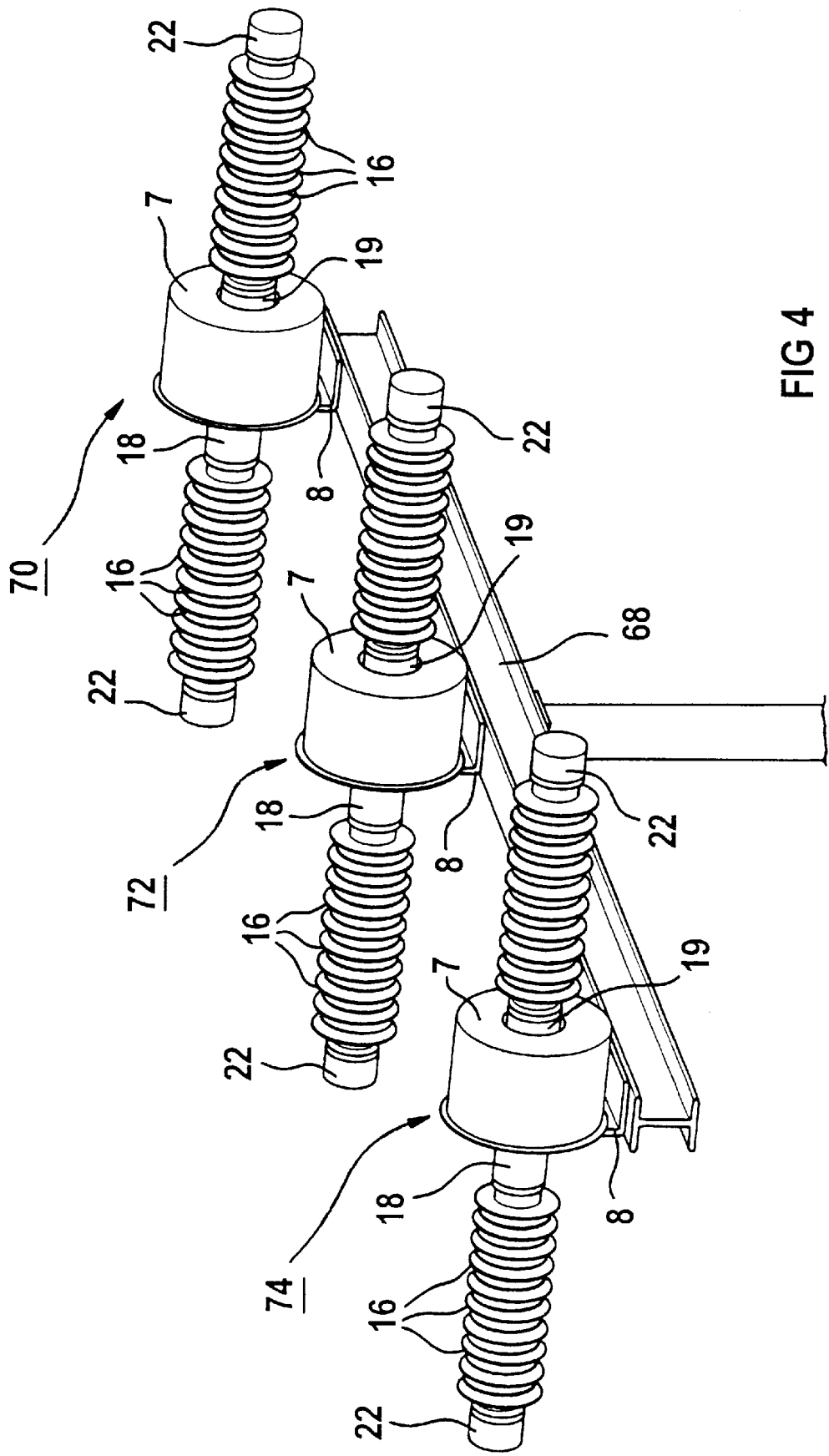
FIG. 4 is a perspective view of three of the measuring configurations in accordance with FIG. 1, which are mounted jointly on the supporting mast.

FIG. 4 shows, likewise in a perspective representation, the configuration of three of measuring configurations 70, 72, 74 in accordance with FIG. 3 or in accordance with FIG. 1 on the common supporting mast 10. Each of the three measuring configurations 70, 72 and 74 is of identical construction and in turn contain in the interior of the weather-resistant tank 7 the electric transformer 6, disposed around a hollow body 26 which can be connected to ground potential, and insulating bodies 2, 3 which are disposed on both sides of the hollow body 26 and are made from a glass fiber reinforced plastic and the sheath 14, applied thereto on the outside, made from a silicone rubber and with a number of the sheds 16.

The insulating bodies 2, 3 are walled around in each case with the electrode bodies 18 and 19 disposed on the outside at the end on the hollow body side. Running in each case in the interior of the measuring configurations 70, 72 and 74 is a continuous electric conductor 4 that can be installed in each case in a high-voltage line via the connections 22. The configuration shown is therefore suitable for directly installing the measuring configurations 70, 72 and 74 in a three-core high-voltage line.

A common carrier 68 in the shape of an H is disposed on the supporting mast 10 for the purpose of bearing and grounding the measuring configurations 70, 72 and 74. The supporting mast 10 and the carrier 68 are produced in this case from a metal, and in particular from steel.

Figure 5:
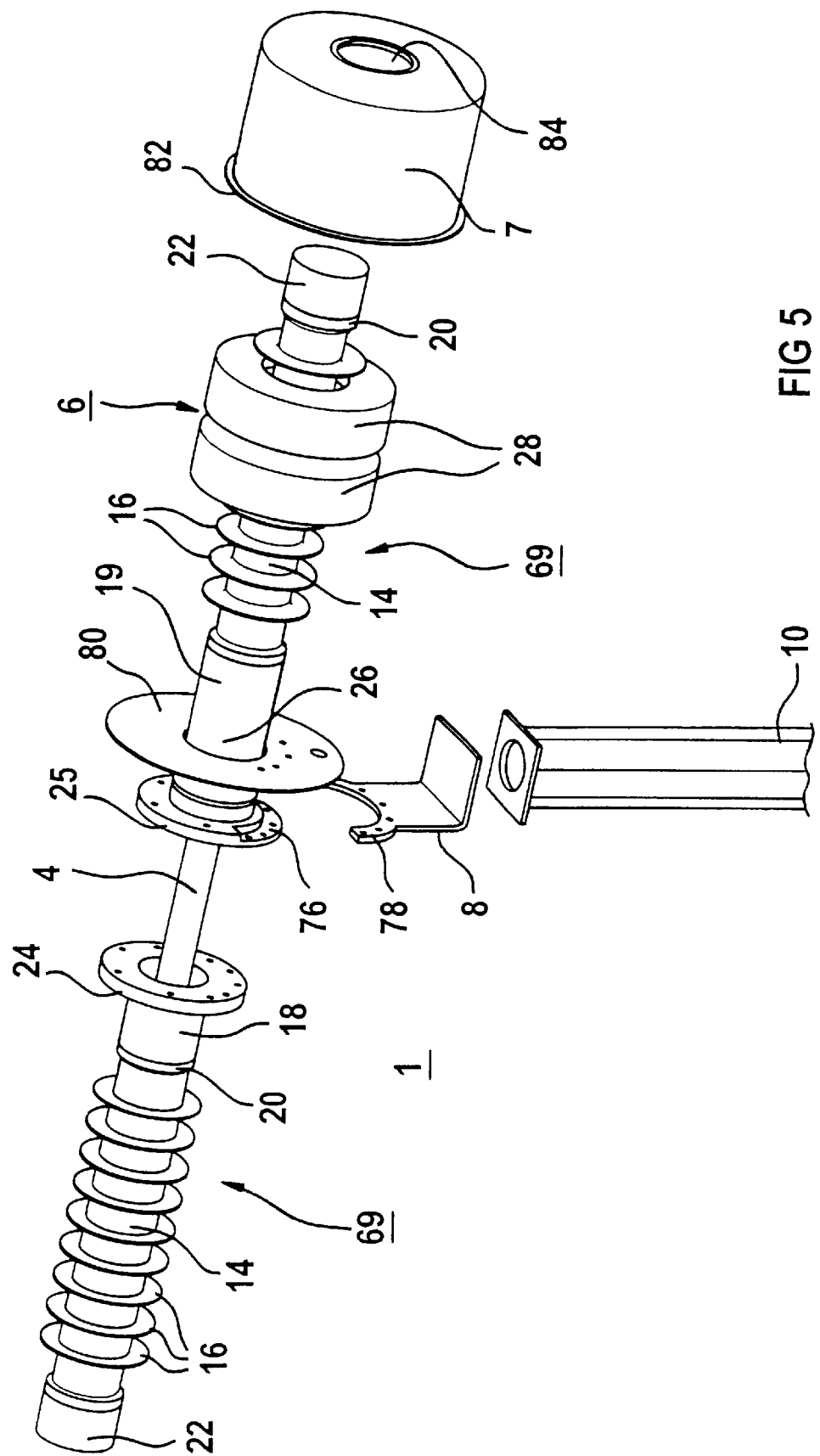
FIG. 5 is an exploded, perspective view of the measuring configuration in accordance with FIG. 1.

FIG. 5 shows an exploded view of the measuring configuration 1 in accordance with FIG. 1. It is clearly visible from FIG. 5 how the measuring configuration 1 can be assembled from the individual components.

The continuous electric conductor 4 leads through the interior of the overall measuring configuration 1. The composite insulator 69 disposed on the left-side in FIG. 5 contains the inner hollow insulating body 2 made from a glass fiber reinforced plastic, of which one end is permanently walled around with the metallic electrode body 18. The electrode body 18 is permanently connected in this case to a section of the insulating body 2 in accordance with the shrink-fit technique. Here, the electrode body 18 forms a single basic unit together with the flange 24. On the side opposite the electrode body 18, the internal insulating body 2 is permanently walled around by the connection 22 for connection to a high-voltage line. When the measuring configuration 1 is assembled, the internal electric conductor 4 makes electric contact with the connecting piece 22.

Disposed on the outside of the insulating body 2 is the sheath 14 that is made from a silicone rubber and has a number of the sheds 16. The section 20 of the electrode body 18 is likewise sheathed by the sheath 14. The same is true of the connecting piece 22.

The composite insulator 69 shown on the right-side in FIG. 5 is of identical construction to the composite insulator 69 shown on the left-side. However, by comparison with the electrode body 18, the electrode body 19 shown in the middle of the measuring configuration 1 is lengthened. In this way, a part of the electrode body 19 simultaneously forms the hollow body 26 over which the electric transformer 6 containing two annular coils 28 is disposed in the finished assembled state.

The side of the electrode body 19 averted from the insulating body 3 is configured as the flange 25 which can be screwed in a gas-tight fashion to the flange 24 of the other composite insulator 69 in a permanent fashion and possibly with the interposition of a seal. The flange 25 is permanently connected to the hollow body 26. However, it can also form a basic unit, in turn, with the hollow body 26. For this purpose, the hollow body 26, the electrode body 19 and the flange 25 are fabricated from one material piece or produced in a casting.

On the lower side, the flange 25 has a cutout 76 into which an accurately fitting mating piece 78 of the fastener 8 engages. The fastener 8 can be permanently screwed to the flange 25 via the mating piece 78. The fastener 8 can, in turn, be permanently connected to the supporting mast 10.

The electric transformer 6 is pushed onto the hollow body 26 over the sheds 16. Since the sheds 16 consist of a flexible silicone rubber, the inside diameter of the annular coils 28 can be selected to be smaller than the outside diameter of the sheds 16. Material and costs can also be saved in this way.

In addition, it is possible to fit on the flange 25 a fastening disk 80 on which an edge 82 of the weather-resistant tank 7 can be fastened. An opening 84 of the weather-resistant tank 7 is larger in this case than the outside diameter of the electrode body 19 and/or the hollow body 26. It is possible in this way to measure the electric variable by the hollow body 26 despite the weather-resistant tank 7 formed of metal. One side of the weather-resistant tank 7 is not in electric contact with the hollow body 26.

Figure 6:
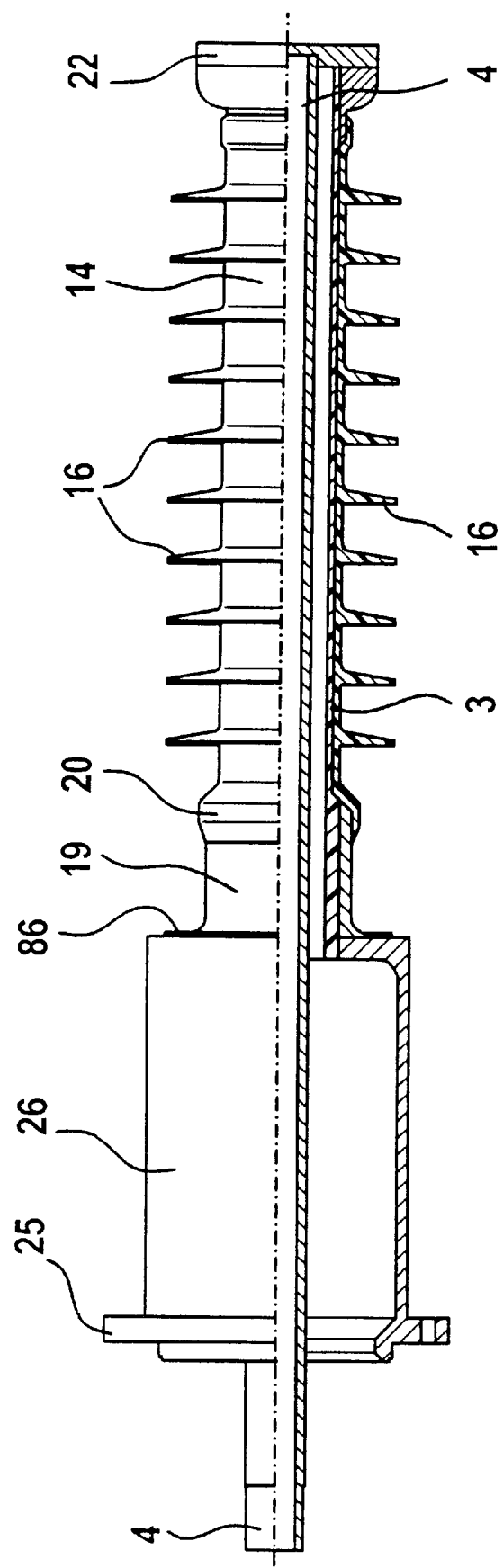
FIG. 6 is a side-elevational view of an insulating body of the measuring configuration in the case of which an electrode body is connected to the hollow body via a screwed connection.

FIG. 6 shows the insulting body 3 of the measuring configuration 1 on the electrode body 19 of which the electrically conductive hollow body 26 is disposed. The continuous electric conductor 4 is shown hereby, in turn.

Disposed in turn on the outside of the insulating body 3 is the sheath 14 made from a silicone rubber that has a number of the sheds 16. The electric conductor 4 makes electric contact with the connecting piece 22 that serves for connecting to the high-voltage line.

A section of the insulating body 3 is permanently walled around with the electrode body 19. In order to produce a high degree of gas-tightness for the connection between the electrode body 19 and the insulating body 3, the section 20 of the electrode body 19 is likewise covered by the sheath 14.

In the case shown, the hollow body 26 has a larger diameter than the electrode body 19. The hollow body 26 is connected to the electrode body 19 via a screwed connection 86. The flange 25 for fastening to the electrode body of the other insulating body of the measuring configuration 1 is configured in a basic unit with the hollow body 26.

Figure 7:
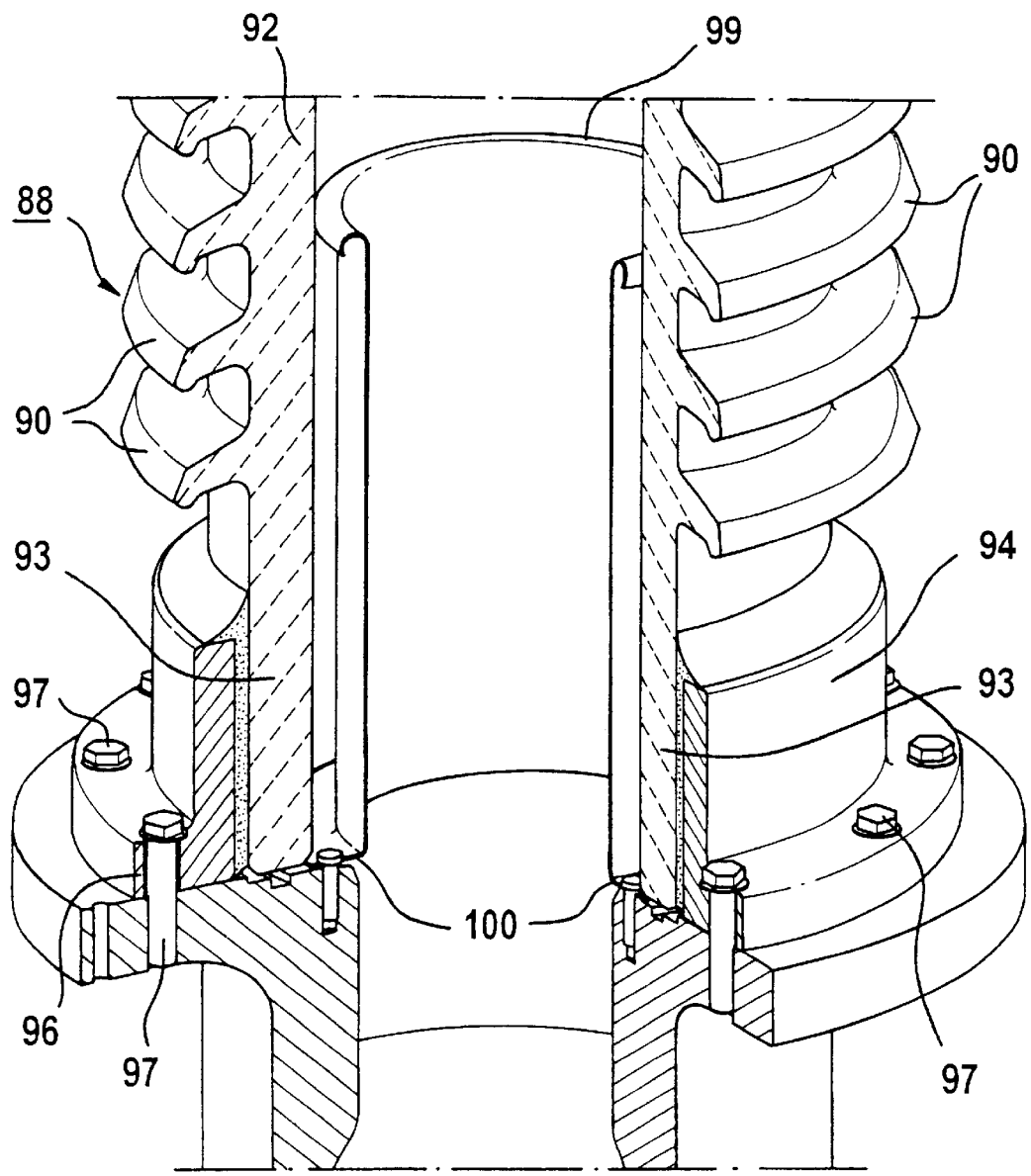
FIG. 7 is a partially broken-away, perspective view of a hollow porcelain insulator with the electrode body disposed in an interior according to the prior art.

A hollow porcelain insulator 88 is represented in FIG. 7 as a component of a bushing of a conventional configuration. The porcelain insulator 88 in this case contains a core 92 that has a number of sheds 90 on the outside. A foot 93 of the core 92 is mounted in a metal part 94 for the purpose of fastening the porcelain insulator 88. The foot 93 is cemented into the metal part 94 for this purpose. The metal part 94 contains a flange 96 that can be permanently connected to another component by screws 97. In accordance with the prior art, a metallic electrode body 99 in the form of a hollow cylinder is fitted in the interior of the porcelain insulator 88. In this case, the electrode body 99 makes electric contact with the metal part 94 via a connecting plate 100. The metal part 94 can be connected to a ground potential.

In the case of application, an electric conductor at high-voltage potential passes through the center of the hollow cylindrical electrode body 99.

It is clearly to be seen in FIG. 7 that the diameter of the core 92 is greater than the diameter of the inner electrode body 99. The size of the diameter of the electrode body 99 is prescribed given a prescribed voltage between the conductor to be led through the porcelain insulator 88 and the electrode body 99. However, the dimension of the porcelain insulator 88 is thereby also determined.

Figure 8:
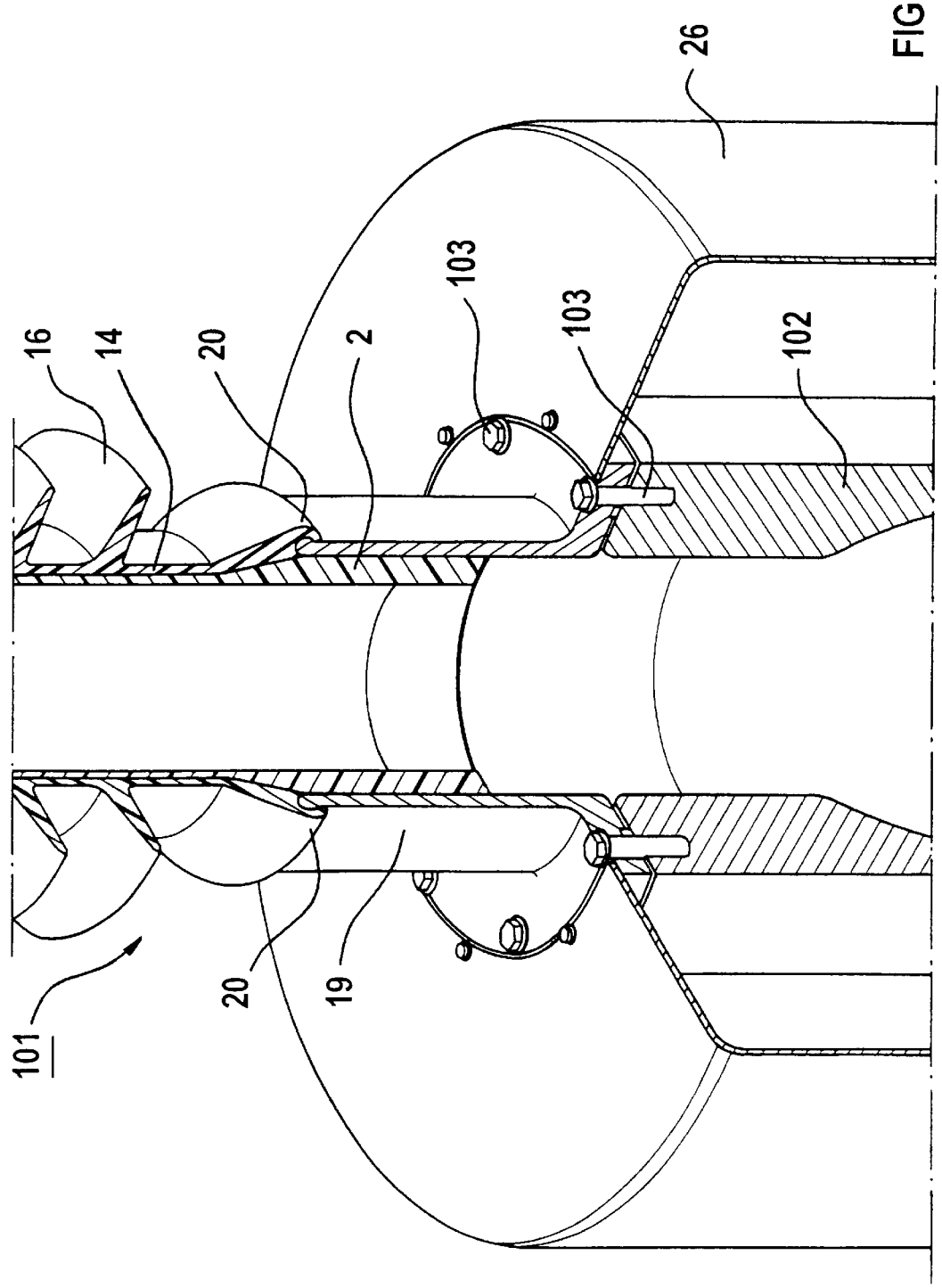
FIG. 8 is a partially broken-away, perspective view of a hollow composite insulator with the electrode body situated on the outside and the hollow body fastened thereon according to the invention.

In contrast to FIG. 7, FIG. 8 shows in a partially broken away representation a hollow composite insulator 101 which contains the tubular insulating body 3 on the outside of which there is disposed the sheath 14 made from a silicone rubber with a number of the sheds 16. A segment of the insulating body 3 is lengthened beyond the sheds 16 and is permanently walled around on the outside with the metallic electrode body 19. The segment 20 of the electrode body 19 is likewise embraced by the sheath 14.

In the case of application, an electric conductor at high-voltage potential passes through the center of the insulting body 3. The electrode body 19 is at ground potential in this case.

Given the same spacing of the electrode body 19 from the internal continuous electric conductor, the diameter of the insulating body 3 of the composite insulator 101 in accordance with FIG. 8 is smaller than the diameter of the core 92 of the porcelain insulator 88 in accordance with FIG. 7. However, given comparable physical conditions, the dimensions of the composite insulator 101 in accordance with FIG. 8 are therefore substantially smaller than the dimensions of the porcelain insulator 88 in accordance with FIG. 7.

In addition, a section of the insulating body 3 is disposed in the interior of the electrode body 19. This section of the insulating body 3 has a high dielectric constant, with the result that, given an identical voltage to be insulated, the spacing between the continuous electric conductor and the electrode body can be further reduced than is possible in FIG. 7, without having to fear an electric flashover. This further increases the difference in the dimensions for a composite insulator 101 with the outer electrode body 19 in accordance with FIG. 8 by comparison with the porcelain insulator 88 of conventional configuration with the inner electrode body 99.

In accordance with FIG. 8, the electrode body 19 is connected to an extension 102 via screws 103. The electrode body 19 is, in turn, a component of the hollow body 26, as is required for a measuring configuration in accordance with FIGS. 1, 3, 4 or 5.

Figure 9:
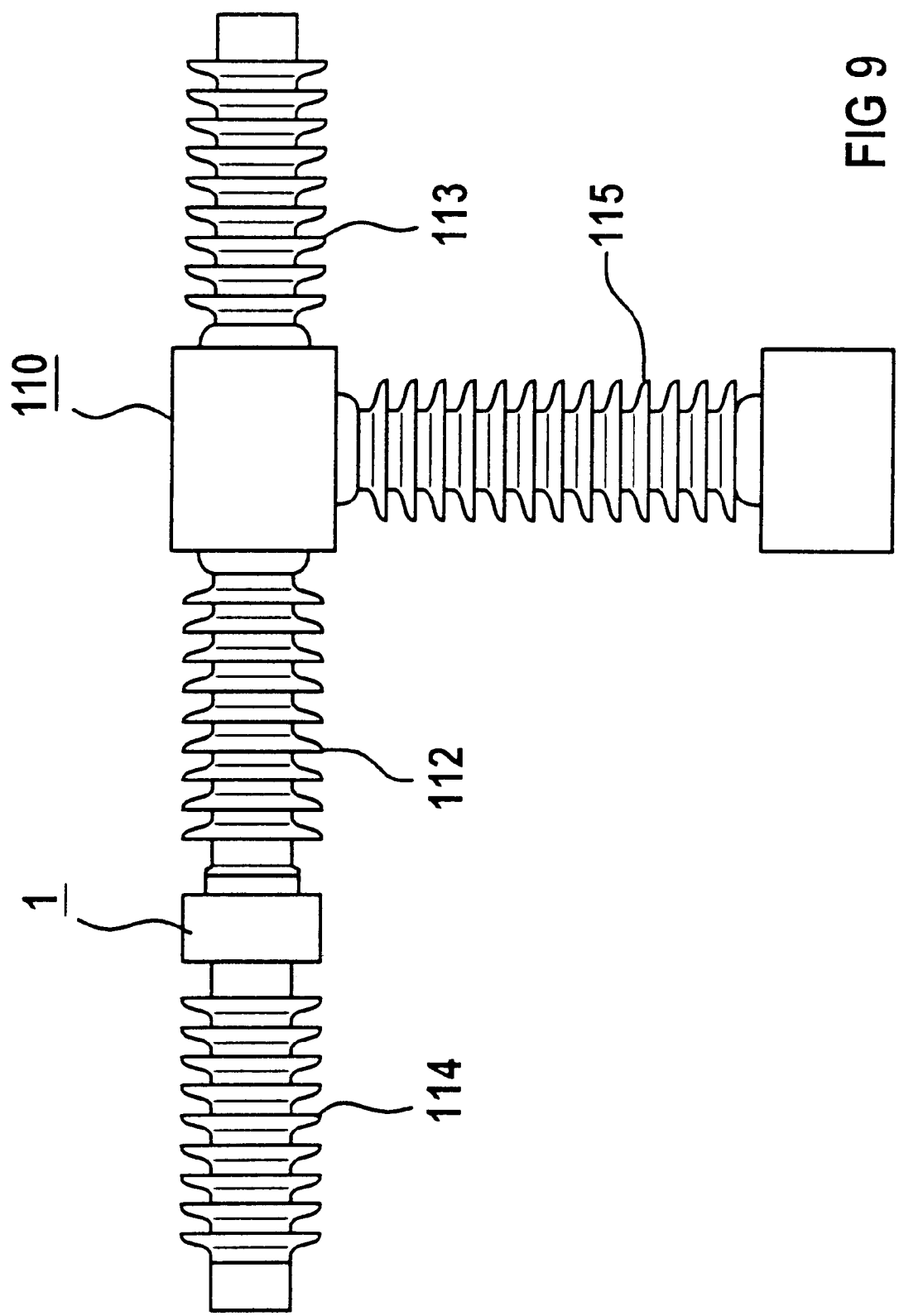
FIG. 9 is a front-elevational view of the measuring configuration in combination with a live-tank high-voltage switching device.

In FIG. 9, the measuring configuration 1 with the insulating bodies 2, 3 can be used in combination with a live-tank high-voltage switching device 110. In this case, the live-tank high-voltage switching device 110 is understood to be a high-voltage switching device 110 in which each switching element 116 for interrupting the high-voltage line is disposed in the vicinity or in the interior of a tank at a high-voltage potential (live). Such high-voltage switching devices 110 are customary in Europe and are borne at the height of the high-voltage line by a separate post insulator constructed for the load to be borne. In order to detect the switching instant suitable for the high-voltage switching device 110, it is known to provide the measuring configuration for determining the voltage in the high-voltage line, in accordance with the prior art configuration described at the beginning, separately on an appropriate post insulator at a short spacing from the high-voltage switching device. Owing to the low dead weight of the measuring configuration 1 according to the invention, it is now obvious to couple the measuring configuration 1 as directly to the live-tank high-voltage switching device 110, and to co-use a post insulator 115 of the live-tank high-voltage switching device 110 as a supporting mast for the measuring configuration 1 itself.

In a particularly advantageous way, the switching element 116 of the live-tank high-voltage switching device 110 is disposed in the cavity of the measuring configuration 1, i.e. in the interior of the insulating body 3. This drastically reduces the overall installation space and the total number of the individual components of the overall configuration containing the live-tank high-voltage switching device 110 and the measuring configuration 1. However, this does signify a substantial cost advantage by comparison with the previous solutions in accordance with the prior art.

I claim:

1. A configuration for transforming an electric variable into a measurable electric variable, including a current intensity, on a high-voltage line, comprising:

a continuous electric conductor for making contact with the high-voltage line;

at least one hollow insulating body for insulating a potential of the high-voltage line from a ground potential and having an interior formed therein;

an electrically conductive hollow body connected to the ground potential and having an end and an interior formed therein, said electrically conductive hollow body connected to said at least one hollow insulating body in such a way as to define via said interior of said electrically conductive hollow body and said interior of said at least one hollow insulating body a cavity through which said continuous electric conductor is guided;

an electric transformer for converting the electric variable into a measured variable, said electric transformer at least partially externally surrounding said electrically conductive hollow body; and a metallic electrode body surrounding on an outside a section of said at least one insulating body disposed at said end of said electrically conductive hollow body, said metallic electrode body equalizing a present electrical field strength.

2. The configuration according to claim 1, wherein said metallic electrode body is part of said electrically conductive hollow body.

3. The configuration according to claim 1, wherein said at least one hollow insulating body is made from a fiber reinforced plastic.

4. The configuration according to claim 1, wherein said electric transformer is a current transformer.

5. The configuration according to claim 4, wherein said current transformer is a coil.

6. The configuration according to claim 1, including a flange disposed on said metallic electrode body for connecting said at least one hollow insulating body to said metallic electrode body.

7. The configuration according to claim 6, wherein said metallic electrode body and said flange form a basic unit.

8. The configuration according to claim 6, including a fastener connected to said flange, said fastener provided for fastening on a supporting mast.

9. The configuration according to claim 1, wherein said at least one hollow insulating body is two hollow insulating bodies connected to said electrically conductive hollow body in such a way as to produce in said interior of said electrically conductive hollow body and said interior of each of said two insulating bodies said cavity through which said continuous electric conductor is guided.

10. The configuration according to claim 9, wherein said metallic electrode body is two electrode bodies including a first electrode body and a second electrode body, said insulating bodies each have an end section facing said electrically conductive hollow body which in each case is walled around on an outer side by one of said two electrode bodies.

11. The configuration according to claim 10, including a flange, said first electrode body disposed around one of said two insulating bodies is a component of said electrically conductive hollow body, and said second electrode body disposed around the other of said two insulting bodies is connected to said electrically conductive hollow body via said flange.

12. The configuration according to claim 1, including a sheath having a number of sheds disposed on an outside of said at least one insulating body.

13. The configuration according to claim 12, wherein said metallic electrode body has an outer side, and said sheath further surrounding at least a part of said outer side of said metallic electrode body.

14. The configuration according to claim 12, wherein said sheath is formed of an elastomer.

15. The configuration according to claim 14, wherein said elastomer is silicone rubber.

16. The configuration according to claim 1, including a weather-resistant tank covering said electric transformer and said electrically conductive hollow body.

17. The configuration according to claim 16, wherein said weather-resistant tank is formed of an electrically conductive material and is connected to said electrically conductive hollow body on one side in an electrically conductive fashion.

18. The configuration according to claim 1, wherein said cavity is a gas-tight cavity.

19. The configuration according to claim 18, including a protective gas formed of $SF_6$ disposed in said gas-tight cavity.

20. In combination with a live-tank high-voltage switching device having a switching element, a configuration for transforming an electrical variable into a measurable variable, comprising:

a continuous electric conductor making contact with a high-voltage line;

at least one hollow insulating body for insulating a potential of the high-voltage line from a ground potential and having an interior formed therein;

an electrically conductive hollow body connected to the ground potential and having an end and an interior formed therein, said electrically conductive hollow body connected to said at least one hollow insulating body in such a way as to define via said interior of said electrically conductive hollow body and said interior of said at least one hollow insulating body a cavity through which said continuous electric conductor is guided;

an electric transformer for converting the electric variable into a measured variable, said electric transformer at least partially externally surrounding said electrically conductive hollow body; and a metallic electrode body surrounding on an outside a section of said at least one insulating body disposed at said end of said electrically conductive hollow body, said metallic electrode body equalizing a present electrical field strength.

21. The configuration according to claim 20, wherein the switching element is disposed in said cavity.

* * * * *